United States Patent
Tobben (10) Patent No.: US 6,245,629 B1
(45) Date of Patent: Jun. 12, 2001

(54) SEMICONDUCTOR STRUCTURES AND MANUFACTURING METHODS

(75) Inventor: Dirk Tobben, Fishkill, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/276,027

(22) Filed: Mar. 25, 1999

(51) Int. Cl.$^7$ .................................................. H01L 21/20

(52) U.S. Cl. ........................................... 438/386; 438/738

(58) Field of Search ..................................... 438/239, 268, 438/517, 243, 427, 350, 312, 385, 631, 638, 738, 618, 692, 760, 626, 601, 381

(56) References Cited

U.S. PATENT DOCUMENTS 5,256,583 * 10/1993 Hollinger ............................... 437/41
6,103,456 * 8/2000 Töben et al. ........................ 430/317

* cited by examiner

Primary Examiner—Matthew Smith
Assistant Examiner—Calvin Lee
(74) Attorney, Agent, or Firm—Stanton Braden

(57) ABSTRACT

A method for forming source/drain contacts to source/drain regions of an array of transistors. The method includes providing a semiconductor body with a gate oxide layer over the surface of the semiconductor body. The gate oxide layer extends over active areas in the semiconductor body. Gate stacks are provided on the gate oxide layer in columns across the rows of active areas. A dielectric material is deposited over the surface of the provided semiconductor body. Vias are etched through the dielectric material over source/drain regions in portions of the active area between the columns of gate stacks. First portion of sidewalls of such vias are formed over portions of adjacent columns of the gate stacks and second portions of the sidewalls of such vias are formed between adjacent columns of the gate stacks. The vias expose portions of the gate oxide layer over the source/drain regions. Source/drain contacts are formed in the vias, such formation comprising: forming spacers on the sidewalls of the regions of dielectric material; exposing the exposed portions of the gate oxide to an etch to remove such exposed portions of the gate oxide layer, such etch etching the gate oxide at a substantially higher etch rate that to the spacers; and forming conductive materials on the spacers and in contact with the source/drain regions.

26 Claims, 8 Drawing Sheets

FIG. 6B

SEMICONDUCTOR STRUCTURES AND MANUFACTURING METHODS

BACKGROUND OF THE INVENTION

This invention relates generally to semiconductor structures and manufacturing methods, and more particularly to structures and methods having reduced electrical short circuits between adjacent electrical contacts to the semiconductor.

As is known in the art, as dimensions between adjacent devices in a semiconductor body become smaller and smaller, the probability of electrical shorts between adjacent contacts increases. For example, borderless bitline contacts in Dynamic Random Access Memory (DRAM) arrays suffer from extensive and uncontrolled enlargement surrounding the pre-metal dielectric because of a wet clean performed prior to polycrystalline (poly) silicon deposition. More particularly, referring to FIGS. 1, 2A and 3A, a DRAM array 9 is shown at an early stage in the fabrication thereof. The array 9 is formed in a semiconductor body 10, here single crystal silicon. Here the array includes trench capacitors C as the storage elements. Each storage capacitor C is electrically connected to the drain D region of a CMOS transistor T associated with one of the DRAM cells in the array 9. The transistors T are formed in rows of active areas 11. The rows of active areas are electrically isolated from each other by shallow trench isolation (STI) regions 13. The array includes columns of wordline WL which are provide gate electrodes for the transistors T. Here a pair of adjacent transistors T in each one of the rows share a common source region S. The common source regions S are to be connected to bitlines of the DRAM array. As noted in FIG. 2A, gate electrode stack 15 of two adjacent transistors T in a common row thereof, are formed on a thermally grown gate oxide layer 12, it being understood that dimensions in the FIGS. are not to scale.

Figure 1:
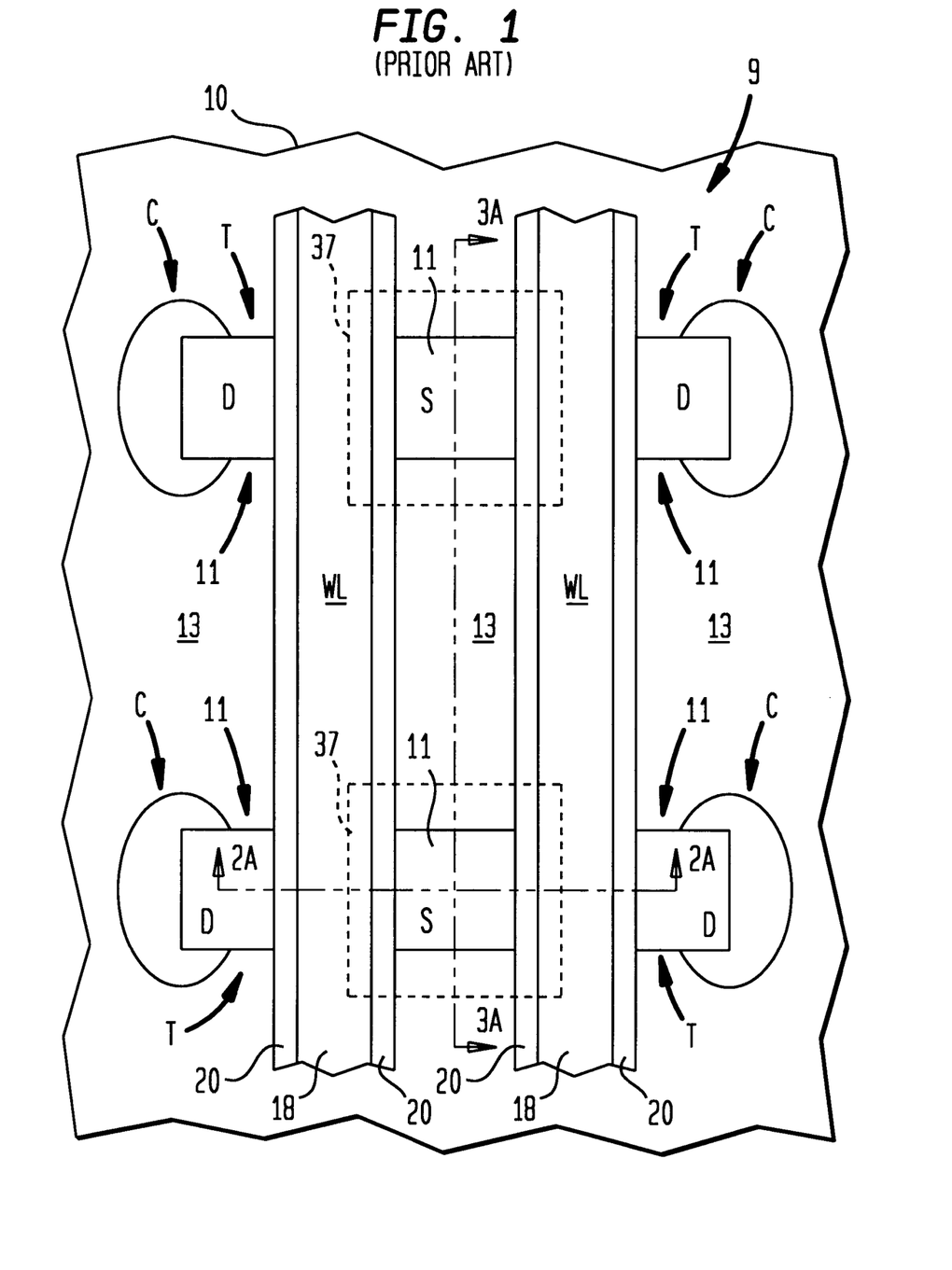
FIGS. 1, 2A through 2F, and 3A through 3F are plan and cross-sectional sketches of a semiconductor structure at various stages in the fabrication thereof according to the PRIOR ART, FIG. 1 showing the plan view of the structure at a first step in such fabrication, FIGS. 2A and 3A being the cross-sectional sketches of such structure at the first stages, FIG. 2A being taken along line 2A—2A in FIG. 1 and FIG. 3A being taken along line 3A—3A in FIG. 1, FIGS. 2B through 2F being sketches of the structure of FIG. 2A at subsequent stages in the fabrication of the structure, and FIGS. 3B through 3F being sketches of the structure of FIG. 3A at subsequent stages in the fabrication of the structure.

Thus, the array of DRAM cells includes a plurality of transistors T disposed in rows of electrically isolated active areas 11 of a surface of a semiconductor body 10. The transistors T have gate stacks 18 disposed in columns across the rows of active areas 11 and source/drain regions, here source regions S, it being understood that the terms source and drain may be used interchangeably, in the regions of the active areas 11 between adjacent pairs of the columns of gate stacks 18. It is also noted that the gate oxide layer 12 is disposed over the entire surface of the silicon body 10. Thus, there are portions of the gate oxide layer 12 on the portions of the active regions 11 under the columns of gate stacks 18 (FIGS. 1 and 2A) as well as on portions of the active regions 11 between the columns of gate stacks 18 (FIGS. 1 and 3A). Here, the gate electrode stack 15 includes a bottom layer 14 of doped polycrystalline silicon, a middle layer 16 of tungsten silicide, and a cap 18 of silicon nitride, as well as silicon nitride sidewall spacers 20.

Figure 2A:
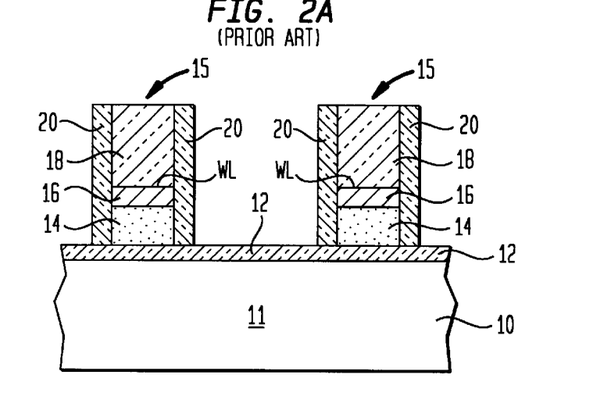
Figure 2B:
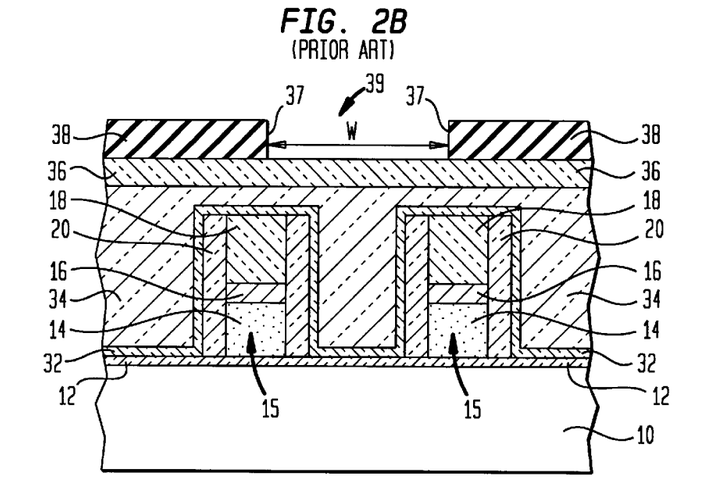
Figure 2C:
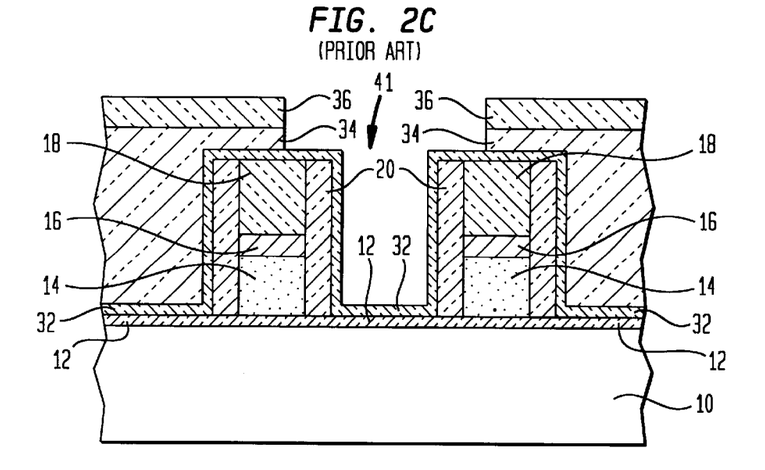
Figure 3A:
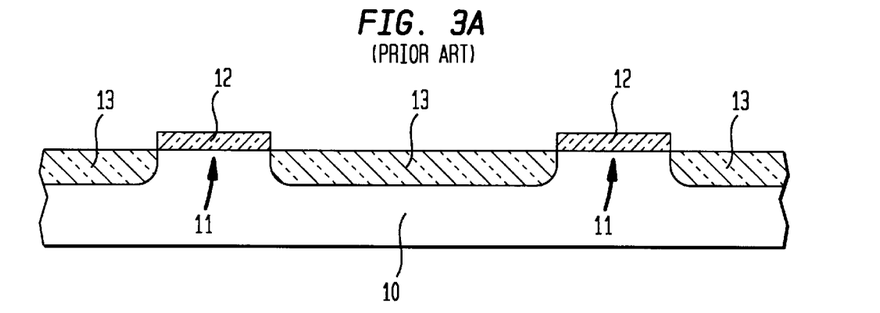
Figure 3B:
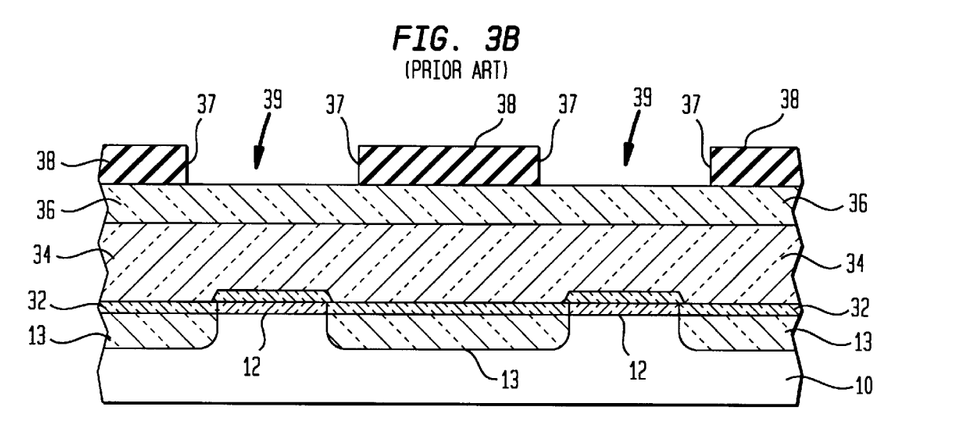
Figure 3C:
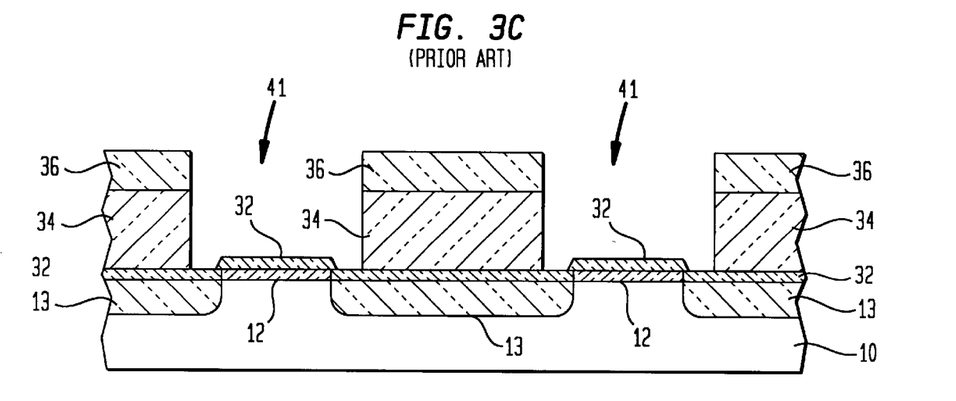

Referring now to FIGS. 2B and 3B, a layer 32 of silicon nitride is formed over the surface of the structure shown in FIGS. 1, 2A and 3A. Next, a pre-metal dielectric layer 34, typically borophosphosilicate glass (BPSG), is deposited, thermally reflowed to fill any gaps, and planarized using chemical mechanical polishing (CMP) to produce the structure shown. It should be understood that, for the BPSG top surface may, or may not, be aligned to the top of the cap 18 of silicon nitride afterwards. Further, in order to improve the reflow, the BPSG has a relatively high amount of boron to accommodate the reflow-temperature requirements of small geometry devices. In any event, a film 36 of doped or undoped silicon oxide is finally deposited as a blanket layer to tune the distance to the next level of metalization. To manufacture a "self-aligned" contact to the source regions, outlined by dotted lines 37 in FIG. 1, a photoresist mask 38 is applied and patterned with windows 39, as shown in FIGS. 2B and 3B. It is noted that the width W of the windows 39 are slightly wider than the gap between the gate electrode stacks 15 (FIG. 2B). The portions of the oxide film 36, BPSG layer 34 stack exposed by the windows 39 are etched with a dry etch (e.g., anisotropic RIE) which removes silicon dioxide in film 36 and BPSG in layer 34 at a substantially higher etch rate than the etch rate of the photoresist mask 38 or the silicon nitride 32. Thus, the etch stops at the silicon nitride layer 32, as indicated in FIG. 2C, 3C. The resulting structure, after the mask 38 is removed, is shown in FIGS. 2C and 3C. It is noted that the contact openings, or vias 41 formed by the etching process are self aligned along the rows of active regions 11 (FIG. 1), as shown in FIG. 2C because of the silicon nitride 32; however, the openings 41 are not self-aligned in the orthogonal direction (i.e., a direction parallel to the columns of wordlines to be formed, as indicated in FIG. 3C.

Figure 2D:
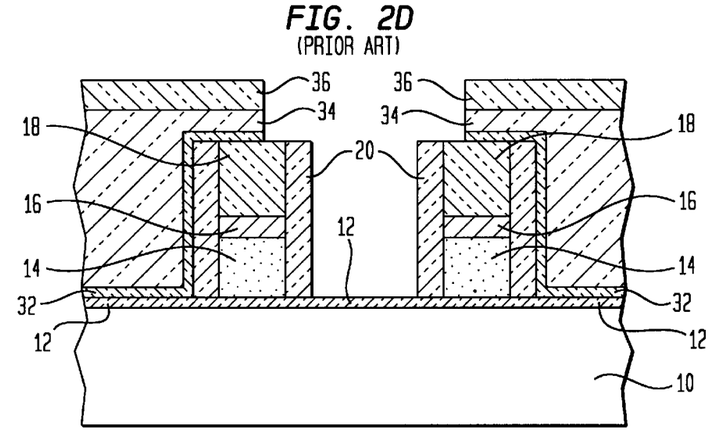
Figure 2E:
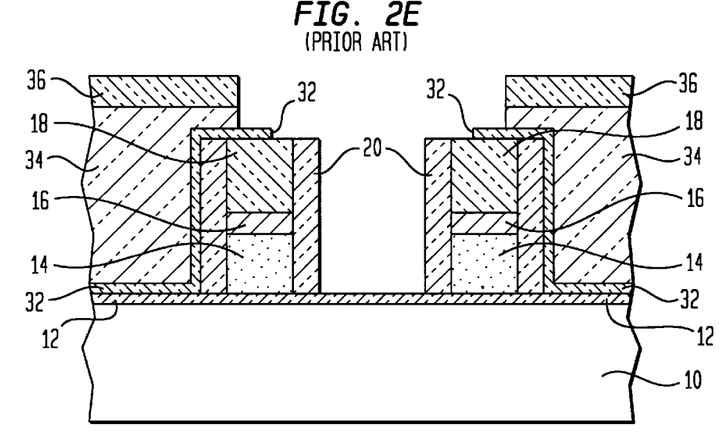
Figure 3D:
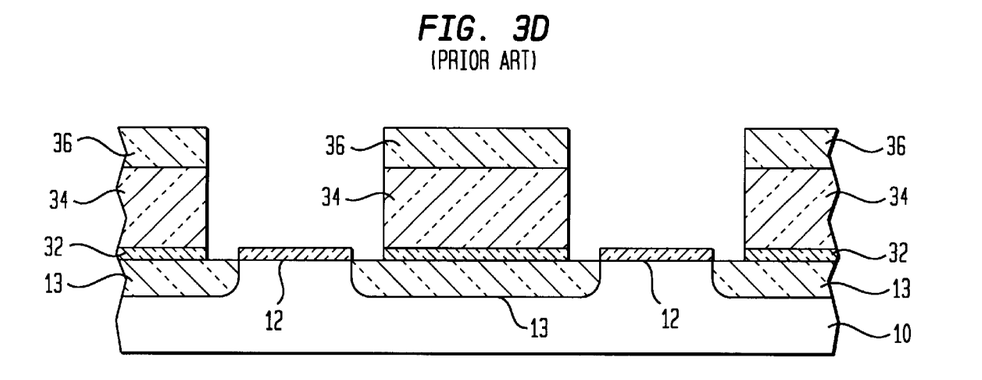
Figure 3E:
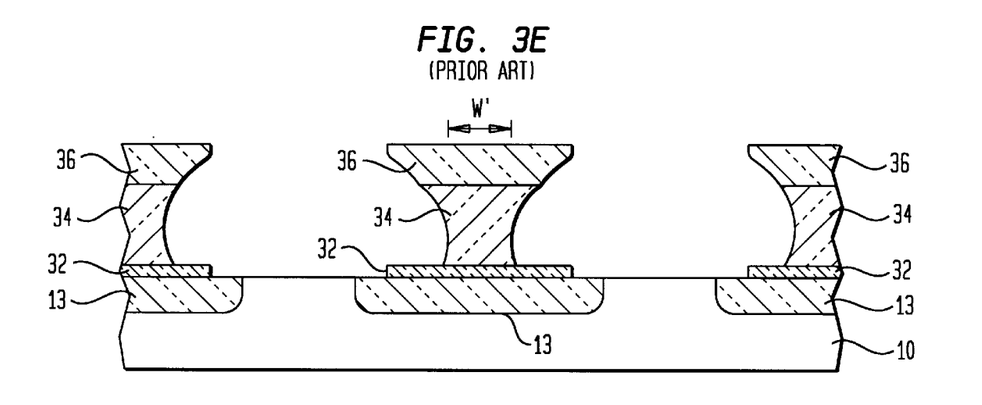

Next, the photoresist mask 38 is stripped, the silicon nitride layer 32 is etched away, with the much thicker silicon nitride spacers 20 being slightly eroded, to produce the structure shown in FIGS. 2D and 3D. To complete the electrical contact to the source regions S, the portions of the gate oxide 12 between the gate electrode stacks 14, must be removed. Typically, a dilute hydrofluoric acid (HF) etch dip is used to: (1) remove any residual material which may remain from the dry etch; and (2) to ensure that the silicon dioxide layer between the gate electrode stacks 14 is totally removed (i.e., the silicon 10 is exposed). The HF etch etches silicon dioxide at a greater etch rate than silicon nitride. The resulting structure is shown in FIGS. 2E and 3E. It is noted that while the silicon nitride spacers provide protection to the gate electrode stacks 14 during the dilute hydrofluoric acid dip, the dip eats into (i.e., etches-out) the portions of the BPSG layer 14 and silicon dioxide 36 along the perpendicular direction (i.e., the direction parallel to the columns of wordlines) because there is no silicon nitride spacers, as indicated in FIGS. 3D and 3E. This etch-out of the BPSG is increased as the amount of boron in the BPSG is increases to accommodate the reflow-temperature requirements of small geometry devices. Thus, the width W' of the BPSG layer 34 and silicon dioxide is significantly reduced.

Figure 2F:
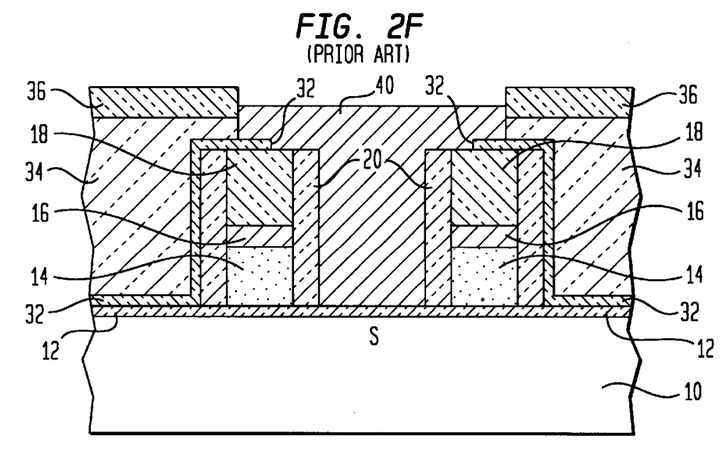
Figure 3F:
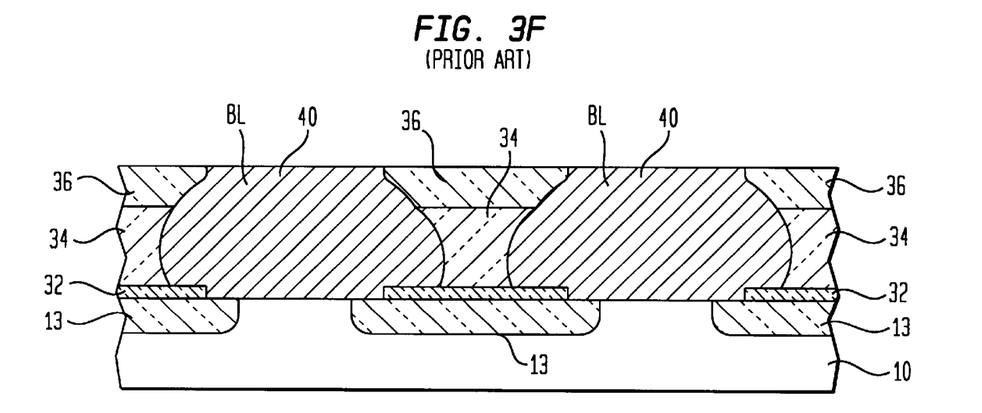

Next, a layer 40 of conductive material 40 is applied to the surface of the structures shown in FIGS. 2E and 3E and then planarized to produce the bitline contacts to the source regions S (FIG. 2F). It is noted, however, in FIG. 3F, that the reduction in the width W' (FIG. 3E) increases the probably of an electrical short between adjacent bitlines, BLs, as shown in FIG. 3F.

As is also known in the art, if the conductive material 40 is doped polycrystalline silicon (i.e., poly), there is no need for implantation provided dopant in the silicon 10, i.e., with doped poly, there is no need for dopant in the silicon to provide an ohmic contact between the doped poly and the silicon. If the conductive material 40 is a metal, however, dopant is required in the silicon 10 in order to achieve ohmic contact. Using ion implantation to provide these doped regions, however, requires a thermal anneal step to activate the implanted ions. The thermal anneal also, however, diffuses the dopant which may have an adverse effect on device characteristics with small devices. Also, polycrystalline silicon fills high aspect rations very well; however, it has a disadvantage over metal because of the relatively high resistance of doped poly compared to that of metal.

SUMMARY OF THE INVENTION

In accordance with one aspect of the invention, a method is provided for forming a semiconductor structure. The method includes: forming a first dielectric on a semiconductor body; forming a second dielectric over the first dielectric; forming a third dielectric over the second dielectric; forming a via through a selected portion of the third dielectric to expose an underlying portion of the second dielectric; forming a via through the exposed portion of the second dielectric to expose an underling portion of the first dielectric; forming a spacer on sidewalls of the vias, such spacer being of a material which etches to an etch at an etch rate substantially lower than the etch rate of the first dielectric to said etch; and, bringing the etch into contact with the spacer and the exposed portion of the first dielectric to remove the exposed portion of the first dielectric.

In accordance with another aspect of the invention, a method is provided for forming source/drain contacts to source/drain regions of an array of transistors. The method includes providing a semiconductor body with a gate oxide layer over the surface of the semiconductor body. The gate oxide layer extends over active areas in the semiconductor body. Gate stacks are provided on the gate oxide layer in columns across the rows of the active areas. A dielectric material is deposited over the surface of the provided semiconductor body. Vias are etched through the dielectric material over source/drain regions provided in portions of the active area between the columns of gate stacks. First portions of sidewalls of such vias are formed over portions of adjacent columns of the gate stacks and second portions of the sidewalls of such vias are formed between adjacent columns of the gate stacks. The vias expose portions of the gate oxide layer over the source/drain regions. Source/drain contacts are formed in the vias, such formation comprising: forming spacers on the sidewalls of the regions of dielectric material; exposing the exposed portions of the gate oxide to an etch to remove such exposed portions of the gate oxide layer, such etch etching the gate oxide at a substantially higher etch rate that to the spacers; and, forming conductive materials on the spacers and in contact with the source/drain regions.

In one embodiment, the columns of gate stacks have silicon nitride sidewall spacers. The dielectric material includes an oxide. The spacers are a material different from the oxide and is resistant to the etch used to etch the oxide. Thus, when the vias are formed through the dielectric material over the regions where the source/drain contact are to be provided, the exposed portions of the gate oxide must be removed. The vias thus expose the portions of the gate oxide and absent the spacers, the dielectric material, which is also an oxide. The spacers, however, are on the sidewalls of the oxide dielectric material and are not etched by the etch used to remove the exposed portions of the gate oxide. Thus, there is no etch-out of the dielectric material. Consequently, the spacers prevent etching of the dielectric material between adjacent source/drain contacts which are disposed between a pair of adjacent columns of the gate stacks thereby enabling the use of boron doped oxide dielectric material.

In accordance with another aspect of the invention a semiconductor structure is provided having a plurality of transistors disposed in rows of electrically isolated active areas of a surface of a semiconductor body. The transistors have gate stacks disposed in columns across the rows of active areas and source/drain regions in the active areas between adjacent pairs of the columns of gate stacks. A dielectric material is disposed over the surface of the semiconductor body. The dielectric material has vias therethrough disposed over the source/drain regions. First portions of the sidewalls of such vias are disposed over portions of adjacent columns of the gate stacks and second portions of the sidewalls of such vias are disposed between adjacent columns of the gate stacks. Source/drain contacts are disposed in the vias. The source/drain contacts include spacers disposed on the sidewalls of the regions of dielectric material and conductive materials disposed on the spacers and in contact with the source/drain regions.

In accordance with another aspect of the invention, the spacers provide a shield to ion implanted particles used to provide a doped, ohmic contact for the source/drain region when a metal conductor is used for the source/drain contact.

In accordance with another aspect of the invention, the spacers are a conductive material to prevent increased resistive to the conductive material in the via.

BRIEF DESCRIPTION OF THE DRAWING

Other features of the invention, as well as the invention itself, will become more readily apparent from the following detailed description when read together with the accompanying drawings, in which.

DESCRIPTION OF THE PREFERRED EMBODIMENTS

Figure 4A:
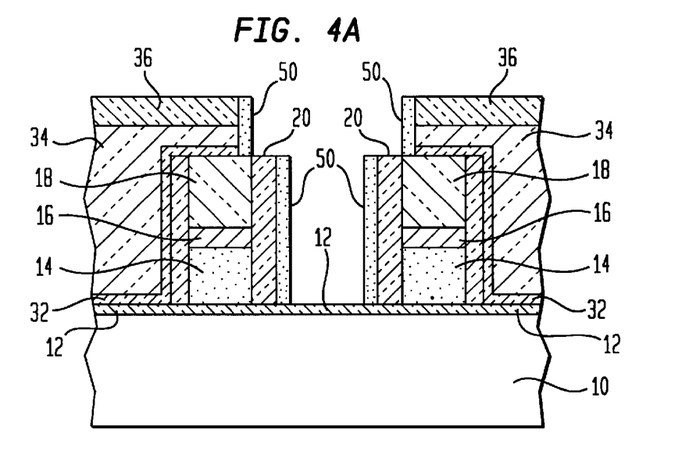
FIGS. 4A through 4C are cross-sectional sketches of fabrication steps performed on the semiconductor structure shown in FIG. 2D at various stages in the fabrication of a semiconductor according to the invention.
Figure 5A:
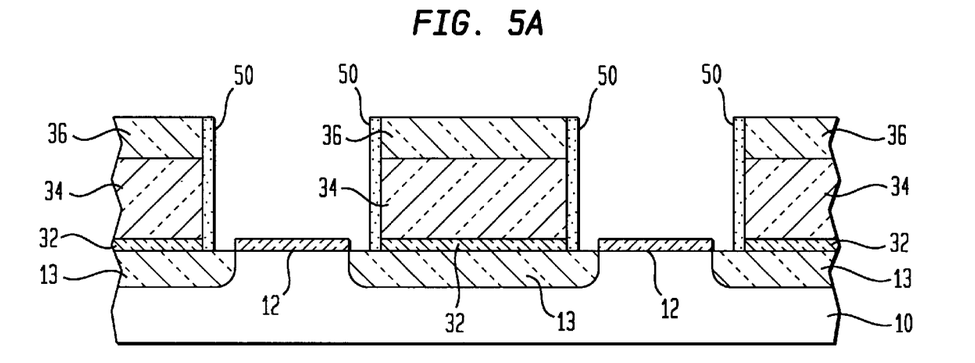
FIGS. 5A through 5C are cross-sectional sketches of fabrication steps performed on the semiconductor structure shown in FIG. 3D at various stages in the fabrication of a semiconductor according to the invention.

Referring now again to FIGS. 2D and 3D, instead of applying an HF dip to remove the thermally grown silicon dioxide layer 12, as described above in connection with FIGS. 2E and 3E, a conformal layer of a conductive, non-hydrofluoric acid etchable material, for example, doped polycrystalline silicon is deposited over the structure shown in FIGS. 2D and 3D. An anisotropic, e.g. Reactive Ion Etch (RIE), is then used to remove horizontally disposed portions of the conformal layer while leaving vertical portions of layer to thereby form spacers 50 on the sidewalls of the silicon dioxide layer 36, the BPSG layer 34, and the silicon nitride layer 20. The resulting structure is shown in FIGS. 4A and 5A. It should be understood that spacers 50 can also be any other conductive material provided that it cannot be etched in buffered hydrofluoric acid or dilute hydrofluoric acid, and that it can take subsequent thermal treatments. It should also adhere to the underlying dielectric films, have acceptable step coverage, and be deposited with sufficient uniformity as a thin film. Other materials include doped and undoped polycrystalline silicon, or sputtered amorphous silicon.

Figure 4B:
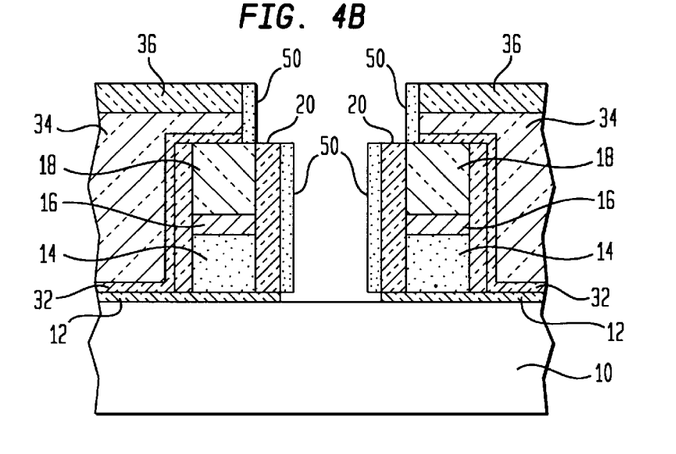
Figure 5B:
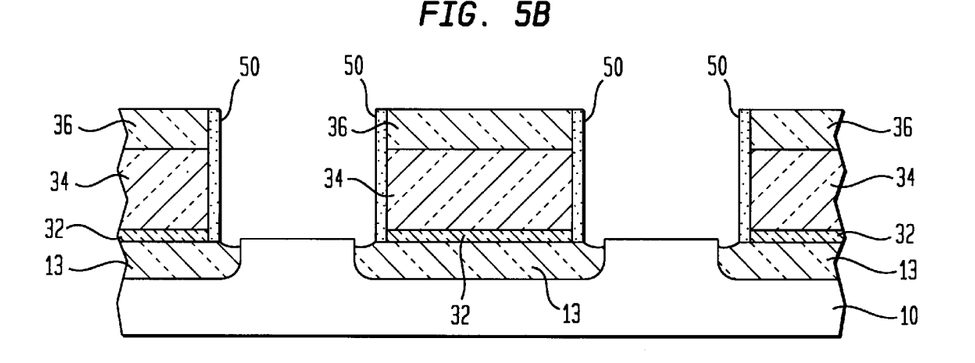

Next, the HF dip described above in connection with FIGS. 2E and 3E is used to remove exposed portions of the gate oxide layer 12 shown in FIGS. 4A and 5A. The resulting structure is shown in FIGS. 4B and 5B. It is noted that there is no etch-out of the BPSG 34 and silicon dioxide 36 (as shown in FIG. 3E) because here these layers 34, 36 are shielded from the hydrofluoric acid dip by the spacers 50. The resulting structure is shown in FIGS. 4B and 5B.

Figure 4C:
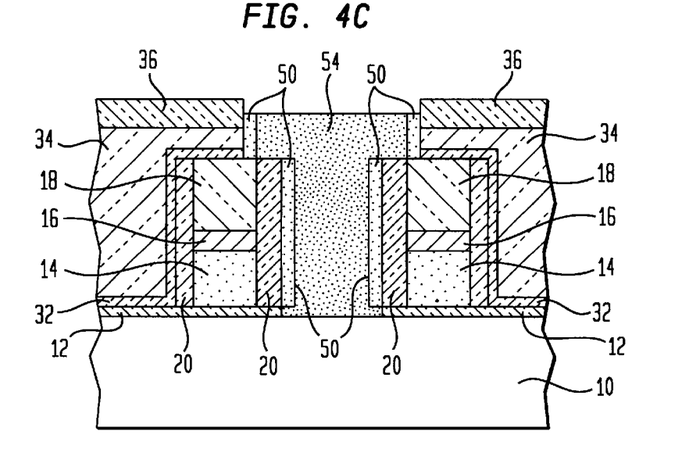
Figure 5C:
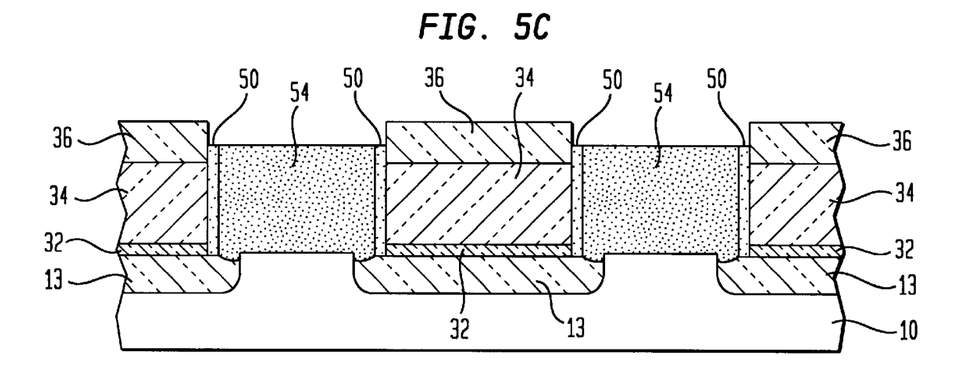

Referring now to FIGS. 4C and 5C, a conductive material 54 is deposited over the surface of the structure shown in FIG. The material 54 in FIGS. 4C and 4D is doped polycrystalline silicon. It is noted that no doping is required in the underlying silicon 10. Further, because the spacer 50 is also conductive, they become part of the conductive bitline and the narrowing of the contact hole because of the spacer 50 does not reduce the area provided for the electrical contact to the silicon 10.

Figure 6A:
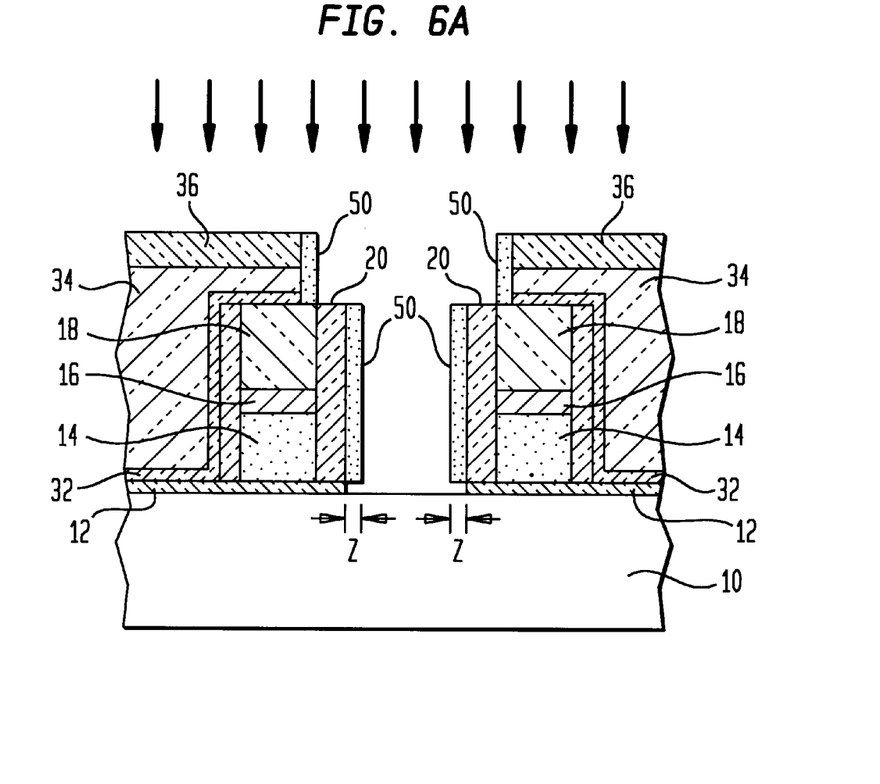
FIGS. 6A and 6B are cross-sectional sketches of fabrication steps performed on the semiconductor structure shown in FIG. 4D at various stages in the fabrication of a semiconductor according to an alternative embodiment of the invention.
Figure 6B:
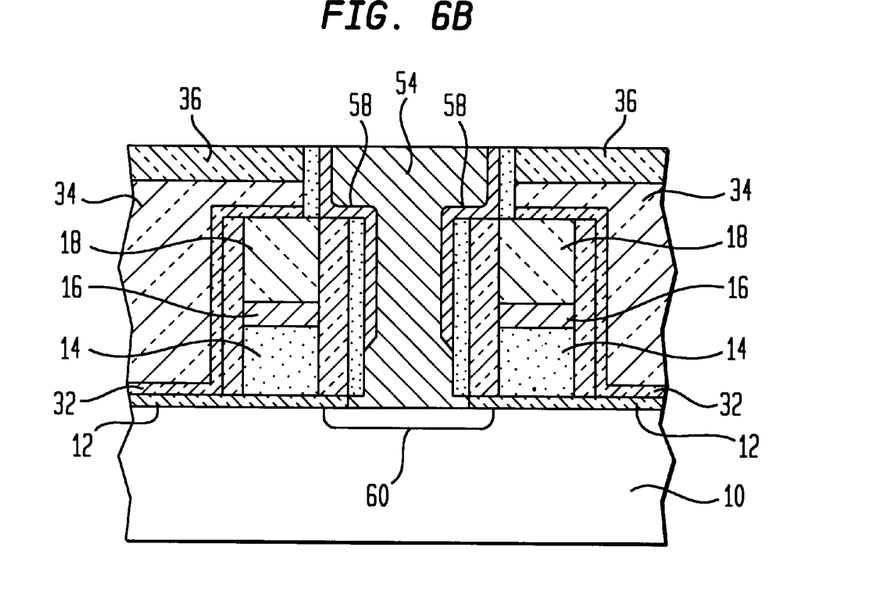

Referring to 6A and 6B, an alternative embodiment is shown. Here, instead of using a polycrystalline silicon material 54 a metal is used. More particularly, after forming the structure shown in FIG. 4B, the structure is subjected to ion implantation, the ions implanted in the exposed silicon 10 being indicated by x's in FIG. 6A. It is noted that the spacers 50 provide a shielding effect to the implantation so that the ions are spaced by a distance Z from the edges of the silicon nitride spacers 20. Here, tungsten is to be used for the conductive material 54. However, because tungsten does not adhere to dielectrics well, a liner 58 of titanium nitride is first deposited using physical vapor deposition. Step coverage is limited for the physical vapor deposition of the titanium nitride liner 58 in the high aspect ratio vias. It is noted that, here, the titanium nitride liner 58 need not reach to the bottom of the via; instead, the final tungsten 54 adheres to the poly sidewall spacers 52 and will fill the via contact area.

The structure is then annealed to activate the ions x and to diffused to dopant and provide doped, ohmic contact region 60.

Other embodiments are within the spirit and scope of the appended claims.

What is claimed is:

1. A method for forming a semiconductor structure, comprising:
   forming a first dielectric on a semiconductor body;
   forming a second dielectric over the first dielectric;
   forming a third dielectric over the second dielectric;
   forming a via through a selected portion of the third dielectric to expose an underlying portion of the second dielectric;
   forming a via through the exposed portion of the second dielectric to expose an underling portion of the first dielectric;
   forming a spacer on sidewalls of the vias, such spacer being of a material which etches to an etch at a rate substantially lower than the rate of the first dielectric to said etch;
   bringing the etch into contact with the spacer and the exposed portion of the first dielectric to remove the exposed portion of the first dielectric.

2. The method recited in claim 1 wherein the first dielectric comprises silicon dioxide.

3. The method recited in claim 2 wherein the third material comprises boron doped glass.

4. The method recited in claim 2 wherein the second dielectric comprises silicon nitride.

5. The method recited in claim 4 wherein the third dielectric comprises boron doped glass.

6. The method recited in claim 5 wherein the spacer comprises silicon.

7. The method recited in claim 6 including forming an electrical contact through the via, such contact being in contact with the spacer and the exposed portion of the semiconductor body.

8. The method recited in claim 7 including forming the contact in ohmic contact with the exposed portion of the semiconductor body.

9. The method recited in claim 1 including forming an electrical contact through the spacer via, such contact being in contact with the spacer and the exposed portion of the semiconductor body.

10. The method recited in claim 9 including forming the contact in ohmic contact with the exposed portion of the semiconductor body.

11. A method for forming source/drain contacts to source/drain regions of an array of transistors, such method comprising:
   (a) providing a semiconductor body with a gate oxide layer over a surface the semiconductor body, such gate oxide layer extending over active areas in the semiconductor body, such body having gate stacks on the gate oxide layer in columns across rows of the active areas, such gate oxide extending over source/drain regions in portions of the active areas;
   (b) forming a dielectric material over the surface of the provided semiconductor body;
   (c) etching vias through the dielectric material over the source/drain regions in portions of the active areas between the columns of the gate stacks, first portions of sidewalls of such vias being formed over portions of adjacent columns of the gate stacks and second portions of the sidewalls of such vias being formed adjacent columns of the gate stacks, such vias exposing the portions of the gate oxide layer over the source/drain regions;
   (d) forming the source/drain contacts in the vias, such formation comprising:
      (i) forming spacers on the sidewalls of the regions of dielectric material;
      (ii) bringing the exposed portions of the gate oxide into contact with an etch to remove such exposed portions of the gate oxide layer, such etch etching the gate oxide layer at a substantially higher rate than the etch rate of the spacers to such etch; and
      (iii) forming conductive materials on the spacers and in contact with the source/drain regions.

12. The method recited in claim 11 wherein the columns of gate stacks are provided with silicon nitride sidewall spacers.

13. The method recited in claim 12 wherein the dielectric material includes an oxide.

14. The method recited in claim 13 wherein the spacers comprise a material different from the oxide and is resistant to the etch used to etch the oxide.

15. The method recited in claim 11 including the step of implanting ions into the source/drain region with the spacers providing a shield to the ion implantation.

16. A method for forming a semiconductor structure, comprising:
- (a) providing a plurality of electrically isolated active areas over the surface of a semiconductor body, such body having gate stacks disposed in columns across the rows of active areas and source/drain regions in the active areas between adjacent pairs of the columns of gate stacks, such semiconductor body having a gate oxide layer on the surface of the active areas of the semiconductor body under the gate stacks and over the source/drain regions;
- (b) forming a dielectric material over the surface of the semiconductor body;
- (c) forming vias through the exposed portions of the dielectric material disposed over the source/drain regions, first portions of sidewalls of such vias being over portions of adjacent columns of the gate stacks and second portions of the sidewalls of such vias being between adjacent columns of the gate stacks, such vias exposing portions of the gate oxide disposed over the source/drain regions;
- (d) forming source/drain contacts in the vias, comprising:
  - (i) forming spacers on the sidewalls of the regions of dielectric material;
  - (ii) bringing an etch into contact with the exposed portions of the gate oxide; and
  - (iii) forming conductive materials on the spacers and in contact with the source/drain regions.

17. The method recited in claim 16 wherein:

the semiconductor body is silicon;

the dielectric material comprises an oxide; and the spacers comprise silicon.

18. The method recited in claim 17 wherein the dielectric material comprises boron doped glass.

19. The method recited in claim 16 wherein the spacers are electrically conductive.

20. The method recited in claim 19 wherein:

the semiconductor body is silicon;

the dielectric material comprises an oxide; and the spacers comprise silicon.

21. A method for forming an array of memory cells, comprising:
- (a) providing storage capacitors electrically connected to transistors with such transistors disposed in rows of electrically isolated active areas of a surface of a semiconductor body, such transistors having source/drain regions in the active areas and gate stacks disposed in columns;
- (b) forming a dielectric material over the surface of the semiconductor body;
- (c) forming vias in the dielectric material over the source/drain regions;
- (d) forming source/drain contacts in the vias, comprising:
  - (i) forming spacers on sidewalls of the vias; and
  - (ii) forming conductive material on the spacers and in contact with the source/drain regions.

22. The method recited in claim 21 wherein:

the semiconductor body is silicon;

the dielectric material comprises an oxide; and the spacers comprise silicon.

23. The method recited in claim 22 wherein the dielectric material comprises boron doped glass.

24. The method recited in claim 23 wherein the spacers are electrically conductive.

25. The method recited in claim 21 wherein:

the semiconductor body is silicon;

the dielectric material comprises an oxide; and the spacers comprise silicon.

26. The method recited in claim 25 wherein the dielectric material comprises boron doped glass.

* * * * *